US012761288B2

(12) United States Patent
Jovanovic et al.

(10) Patent No.: US 12,761,288 B2
(45) **Date of Patent: *Oct. 13, 2026**

(54) METHOD AND SYSTEM FOR THERMAL CONTROL OF DEVICES IN AN ELECTRONICS TESTER

(71) Applicant: AEHR TEST SYSTEMS, Fremont, CA (US)

(72) Inventors: Jovan Jovanovic, Santa Clara, CA (US); Kenneth W. Deboe, Santa Clara, CA (US); Steven C. Steps, Saratoga, CA (US)

(73) Assignee: AEHR TEST SYSTEMS, Fremont, CA (US)

( * ) Notice: Subject to any disclaimer, the term of this patent is extended or adjusted under 35 U.S.C. 154(b) by 226 days.

This patent is subject to a terminal disclaimer.

(21) Appl. No.: 18/648,873

(22) Filed: Apr. 29, 2024

(65) Prior Publication Data

US 2024/0302451 A1 Sep. 12, 2024

Related U.S. Application Data

(60) Continuation of application No. 17/532,298, filed on Nov. 22, 2021, now Pat. No. 12,007,451, which is a (Continued)

(51) Int. Cl.
*G01R 31/50* (2020.01)
*G01R 31/00* (2006.01)
(Continued)

(52) U.S. Cl.
CPC ........... *G01R 31/50* (2020.01); *G01R 31/003* (2013.01); *G01R 31/2831* (2013.01);
(Continued)

(58) Field of Classification Search
CPC ... H01L 22/26; H01L 21/67; H01L 21/67109; H01L 21/67242; H01L 21/67248;
(Continued)

(56) References Cited

U.S. PATENT DOCUMENTS 3,149,897 A 9/1964 Martineck
3,413,613 A 11/1968 Bahrs
(Continued)

FOREIGN PATENT DOCUMENTS

CN 1384922 A 11/2002
CN 1482660 A 3/2004
(Continued)

OTHER PUBLICATIONS

"Extended European Search Report issued on Dec. 7, 2020", European Patent Application No. 18761604.0, (9 pages).
(Continued)

*Primary Examiner* — Son T Le
(74) *Attorney, Agent, or Firm* — Stephen M. De Klerk

(57) ABSTRACT

A tester apparatus is provided. Slot assemblies are removably mounted to a frame. Each slot assembly allows for individual heating and temperature control of a respective cartridge that is inserted into the slot assembly. A closed loop air path is defined by the frame and a heater and cooler are located in the closed loop air path to cool or heat the cartridge with air. Individual cartridges can be inserted or be removed while other cartridges are in various stages of being tested or in various stages of temperature ramps.

24 Claims, 7 Drawing Sheets

Related U.S. Application Data division of application No. 16/576,555, filed on Sep. 19, 2019, now Pat. No. 11,209,497, which is a division of application No. 15/400,771, filed on Jan. 6, 2017, now Pat. No. 10,466,292.

(60) Provisional application No. 62/276,746, filed on Jan. 8, 2016.

(51) Int. Cl.
*G01R 31/28* (2006.01)
*H10P 72/00* (2026.01)
*H10P 72/76* (2026.01)
*H10P 74/00* (2026.01)
*H10P 95/90* (2026.01)
*G01R 1/04* (2006.01)

(52) U.S. Cl.
CPC ...... *G01R 31/2875* (2013.01); *H10P 72/0432* (2026.01); *H10P 72/0434* (2026.01); *H10P 72/0602* (2026.01); *H10P 72/7624* (2026.01); *H10P 74/238* (2026.01); *H10P 95/90* (2026.01); *G01R 1/0491* (2013.01)

(58) Field of Classification Search
CPC ............. H01L 21/324; H01L 21/68785; H01L 21/67103; G01R 31/28; G01R 31/2817; G01R 31/2831; G01R 31/2849; G01R 31/2855; G01R 31/2862; G01R 31/2863; G01R 31/003
See application file for complete search history.

(56) References Cited

U.S. PATENT DOCUMENTS 3,482,201 A 12/1969 Schneck
3,757,219 A 9/1973 Aksu
3,970,934 A 7/1976 Aksu
4,240,021 A 12/1980 Kashima et al.
4,298,237 A 11/1981 Griffith et al.
4,400,049 A 8/1983 Schuck
4,473,798 A 9/1984 Cedrone et al.
4,477,170 A 10/1984 Yamada et al.
4,517,512 A 5/1985 Petrich et al.
4,582,386 A 4/1986 Martens
4,591,217 A 5/1986 Reimer
4,608,679 A 8/1986 Rudy et al.
4,719,411 A 1/1988 Buehler
4,746,861 A 5/1988 Nesbitt
4,814,573 A 3/1989 Check et al.
4,816,754 A 3/1989 Buechele et al.
4,968,931 A 11/1990 Littlebury et al.
4,981,449 A 1/1991 Buchter
4,995,814 A 2/1991 Weidler
5,008,615 A 4/1991 Littlebury
5,034,688 A 7/1991 Moulene et al.
5,086,269 A 2/1992 Nobi
5,108,302 A 4/1992 Pfaff
5,247,521 A 9/1993 Akao et al.
5,461,326 A 10/1995 Woith et al.
5,467,024 A 11/1995 Swapp
5,515,126 A 5/1996 Baxter et al.
5,517,126 A 5/1996 Yamaguchi
5,534,785 A 7/1996 Yoshizaki et al.
5,550,466 A 8/1996 Botka
5,559,446 A 9/1996 Sano
5,666,288 A 9/1997 Jones et al.
5,773,986 A 6/1998 Thompson et al.
5,807,104 A 9/1998 Ikeya et al.
5,808,896 A 9/1998 Weber
5,821,440 A 10/1998 Khater et al.
5,851,143 A 12/1998 Hamid
5,886,535 A 3/1999 Budnaitis
5,894,225 A 4/1999 Coffin
5,928,036 A 7/1999 Thrush
5,945,834 A 8/1999 Nakata et al.
5,966,022 A 10/1999 Budnaitis et al.
5,973,285 A 10/1999 Dietrich et al.
5,982,183 A 11/1999 Sano
6,005,401 A 12/1999 Nakata et al.
6,023,173 A 2/2000 Khater et al.
6,037,796 A 3/2000 Graef et al.
6,040,700 A 3/2000 Berar
6,057,696 A 5/2000 Orso et al.
6,084,215 A 7/2000 Furuya et al.
6,084,419 A 7/2000 Sato et al.
6,091,060 A 7/2000 Getchel et al.
6,094,059 A 7/2000 Frankeny et al.
6,094,060 A 7/2000 Frankeny et al.
6,124,725 A 9/2000 Sato
6,135,699 A 10/2000 Yutaka et al.
6,137,303 A 10/2000 Deckert et al.
6,147,506 A 11/2000 Ahmad et al.
6,152,744 A 11/2000 Maeda
6,203,582 B1 3/2001 Berner
6,244,874 B1 6/2001 Tan
6,255,834 B1 7/2001 Smith
6,268,740 B1 7/2001 Iida
6,318,243 B1 11/2001 Jones
6,339,321 B1 1/2002 Yamashita et al.
6,340,895 B1 1/2002 Uher et al.
6,358,061 B1 3/2002 Regnier
6,381,283 B1 4/2002 Bhardwaj et al.
6,384,377 B1 5/2002 Komuro
6,384,613 B1 5/2002 Cheng
6,421,754 B1 7/2002 Kau et al.
6,509,751 B1 1/2003 Mathieu et al.
6,515,497 B1 2/2003 Matsuzawa
6,535,824 B1 3/2003 Mansky et al.
6,593,763 B2 7/2003 Weber
6,625,557 B1 9/2003 Perkins et al.
6,628,520 B2 9/2003 Patel et al.
6,644,982 B1 11/2003 Ondricek et al.
6,665,929 B1 12/2003 Bright
6,744,269 B1 6/2004 Johnson et al.
6,853,209 B1 2/2005 Jovanovic
6,867,608 B2 3/2005 Richmond et al.
6,876,321 B1 4/2005 Slutzky et al.
6,888,343 B1 5/2005 Holt et al.
6,992,496 B2 1/2006 Winter et al.
6,994,563 B2 2/2006 Amini et al.
7,053,644 B1 5/2006 Lindsey et al.
7,108,517 B2 9/2006 Harper
7,137,849 B2 11/2006 Nagata
7,260,303 B2 8/2007 Bench et al.
7,332,918 B2 2/2008 Sugiyama et al.
7,382,142 B2 6/2008 Chong et al.
7,453,260 B2 11/2008 Boyle et al.
7,480,129 B2 1/2009 Brown et al.
7,501,617 B2 3/2009 Hayami et al.
7,762,822 B2 7/2010 Richmond, II
7,800,382 B2 9/2010 Lindsey et al.
7,826,995 B2 11/2010 Maenner
7,859,285 B2 12/2010 Sheu et al.
7,969,175 B2 6/2011 Hendrickson et al.
8,030,957 B2 10/2011 Lindsey et al.
8,035,406 B2 10/2011 Mueller
8,057,263 B1 11/2011 Howard et al.
8,118,618 B2 2/2012 Richmond, II et al.
8,149,008 B2 4/2012 Yamada et al.
8,228,085 B2 7/2012 Lindsey et al.
8,299,935 B2 10/2012 Kiyokawa et al.
8,388,357 B2 3/2013 Richmond, II et al.
8,444,107 B2 5/2013 Akouka et al.
8,462,471 B2 6/2013 Huang et al.
8,465,327 B2 6/2013 Springer et al.
8,506,335 B2 8/2013 Richmond et al.
8,628,336 B2 1/2014 Richmond, II et al.
8,947,116 B2 2/2015 Lindsey et al.
8,974,116 B2 3/2015 Okamoto et al.
9,250,291 B2 2/2016 Lindsey et al.
9,291,668 B2 3/2016 Steps
9,316,683 B2 4/2016 Richmond, II et al.

(56) References Cited

U.S. PATENT DOCUMENTS

| | | | |
|---|---|---|---|
| 9,625,521 | B2 | 4/2017 | Lindsey et al. |
| 9,880,197 | B2 | 1/2018 | Lindsey et al. |
| 10,269,678 | B1 | 4/2019 | Viswanathan et al. |
| 10,297,339 | B2 | 5/2019 | Thordarson et al. |
| 10,401,385 | B2 | 9/2019 | Lindsey et al. |
| 10,466,292 | B2 | 11/2019 | Jovanovic |
| 11,112,429 | B2 | 9/2021 | Lindsey et al. |
| 11,255,903 | B2 | 2/2022 | Richmond, II et al. |
| 11,448,695 | B2 | 9/2022 | Lindsey et al. |
| 11,592,465 | B2 | 2/2023 | Lindsey et al. |
| 11,835,575 | B2 | 12/2023 | Erickson, II |
| 11,977,089 | B2 | 5/2024 | Lindsey et al. |
| 12,228,609 | B2 | 2/2025 | Erickson et al. |
| 12,253,560 | B2 | 3/2025 | Erickson et al. |
| 12,282,062 | B2 | 4/2025 | Erickson et al. |
| 12,292,484 | B2 | 5/2025 | Jovanovic |
| 2001/0012726 | A1 | 8/2001 | O'Neal et al. |
| 2001/0032663 | A1 | 10/2001 | Pelrine |
| 2002/0003432 | A1 | 1/2002 | Leas et al. |
| 2002/0030502 | A1 | 3/2002 | Uher |
| 2002/0032896 | A1 | 3/2002 | Fukuda et al. |
| 2002/0036342 | A1 | 3/2002 | Koide |
| 2002/0048826 | A1 | 4/2002 | Richmond et al. |
| 2002/0050402 | A1 | 5/2002 | Japp et al. |
| 2002/0066726 | A1 | 6/2002 | Cole, Sr. et al. |
| 2002/0067180 | A1 | 6/2002 | Jaimsomporn et al. |
| 2002/0070741 | A1 | 6/2002 | Siew et al. |
| 2002/0106927 | A1 | 8/2002 | Bosy et al. |
| 2002/0139169 | A1 | 10/2002 | Lueth, II et al. |
| 2002/0144213 | A1 | 10/2002 | Ramaswamy et al. |
| 2003/0020459 | A1 | 1/2003 | Lambert |
| 2003/0057130 | A1 | 3/2003 | Fix et al. |
| 2003/0077932 | A1 | 4/2003 | Lewinnek |
| 2003/0099097 | A1 | 5/2003 | Mok |
| 2003/0115037 | A1 | 6/2003 | Sumida |
| 2003/0122550 | A1 | 7/2003 | Kanamaru et al. |
| 2003/0137317 | A1 | 7/2003 | Kim et al. |
| 2003/0237061 | A1 | 12/2003 | Miller et al. |
| 2004/0012403 | A1 | 1/2004 | Richmond, II et al. |
| 2004/0070413 | A1 | 4/2004 | Kasukabe et al. |
| 2004/0113640 | A1 | 6/2004 | Cooper et al. |
| 2004/0113645 | A1 | 6/2004 | Richmond, II et al. |
| 2004/0113646 | A1 | 6/2004 | Yamashita |
| 2004/0124829 | A1 | 7/2004 | Swettlen et al. |
| 2004/0183561 | A1 | 9/2004 | Takekoshi et al. |
| 2004/0212382 | A1 | 10/2004 | Cram |
| 2004/0217772 | A1 | 11/2004 | Kline |
| 2004/0223309 | A1 | 11/2004 | Haemer |
| 2005/0007137 | A1 | 1/2005 | Gunn et al. |
| 2005/0026311 | A1 | 2/2005 | Wasserbauer et al. |
| 2005/0042932 | A1 | 2/2005 | Mok et al. |
| 2005/0077281 | A1 | 4/2005 | Hamilton et al. |
| 2005/0093561 | A1 | 5/2005 | Watanabe et al. |
| 2005/0103034 | A1 | 5/2005 | Hamilton et al. |
| 2005/0111944 | A1 | 5/2005 | Aho et al. |
| 2005/0125712 | A1 | 6/2005 | Co et al. |
| 2005/0156611 | A1 | 7/2005 | Shinde et al. |
| 2005/0206368 | A1 | 9/2005 | Lopez et al. |
| 2005/0277323 | A1 | 12/2005 | Eldridge et al. |
| 2006/0068614 | A1 | 3/2006 | Harper |
| 2006/0091212 | A1 | 5/2006 | Chein et al. |
| 2006/0125502 | A1 | 6/2006 | Lindsey et al. |
| 2006/0132159 | A1 | 6/2006 | Tamaishi |
| 2006/0139042 | A1 | 6/2006 | Kasukabe |
| 2006/0170435 | A1 | 8/2006 | Granicher et al. |
| 2006/0186904 | A1 | 8/2006 | Natsuhara et al. |
| 2006/0198211 | A1 | 9/2006 | Frankowsky |
| 2006/0263925 | A1 | 11/2006 | Chandler |
| 2007/0001790 | A1 | 1/2007 | Richmond, II et al. |
| 2007/0018681 | A1 | 1/2007 | Sartschev |
| 2007/0028834 | A1 | 2/2007 | Awazu et al. |
| 2007/0029979 | A1 | 2/2007 | Williams et al. |
| 2007/0107656 | A1 | 5/2007 | Shinozaki et al. |
| 2007/0269999 | A1 | 11/2007 | De Stefano |
| 2007/0273216 | A1 | 11/2007 | Farbarik |
| 2007/0296422 | A1 | 12/2007 | Miller |
| 2008/0022695 | A1 | 1/2008 | Welle |
| 2008/0048688 | A1 | 2/2008 | Mathieu et al. |
| 2008/0079451 | A1 | 4/2008 | Maenner |
| 2008/0124951 | A1 | 5/2008 | Cox et al. |
| 2008/0143365 | A1 | 6/2008 | Kiesewetter et al. |
| 2008/0150125 | A1 | 6/2008 | Braunisch et al. |
| 2008/0186046 | A1 | 8/2008 | Yun et al. |
| 2008/0224723 | A1 | 9/2008 | Washio et al. |
| 2009/0015282 | A1 | 1/2009 | Steps et al. |
| 2009/0039906 | A1 | 2/2009 | Yamada et al. |
| 2009/0102497 | A1 | 4/2009 | Ito et al. |
| 2009/0143923 | A1 | 6/2009 | Breed |
| 2009/0160468 | A1 | 6/2009 | Lindsey et al. |
| 2009/0212803 | A1 | 8/2009 | Yamamoto et al. |
| 2009/0237102 | A1 | 9/2009 | Lou et al. |
| 2010/0063637 | A1 | 3/2010 | Crowell et al. |
| 2010/0141288 | A1 | 6/2010 | Di Lello |
| 2010/0175866 | A1 | 7/2010 | Tani et al. |
| 2010/0213957 | A1 | 8/2010 | Richmond et al. |
| 2010/0213960 | A1 | 8/2010 | Mok et al. |
| 2010/0244866 | A1 | 9/2010 | Lindsey et al. |
| 2010/0254426 | A1 | 10/2010 | Okamoto et al. |
| 2011/0003403 | A1 | 1/2011 | Hiraiwa et al. |
| 2011/0006800 | A1 | 1/2011 | Lindsey et al. |
| 2011/0037494 | A1 | 2/2011 | Hung et al. |
| 2011/0194924 | A1 | 8/2011 | Kobayashi et al. |
| 2011/0248737 | A1 | 10/2011 | Takeshita et al. |
| 2011/0271159 | A1 | 11/2011 | Ahn et al. |
| 2011/0273831 | A1 | 11/2011 | Kyle |
| 2011/0286735 | A1 | 11/2011 | Temblay |
| 2011/0298630 | A1 | 12/2011 | Kiyokawa et al. |
| 2011/0316577 | A1 | 12/2011 | Lindsey et al. |
| 2012/0043984 | A1 | 2/2012 | Yashar et al. |
| 2012/0075807 | A1 | 3/2012 | Refai-Ahmed et al. |
| 2012/0136614 | A1 | 5/2012 | Liu et al. |
| 2012/0142210 | A1 | 6/2012 | Stefano |
| 2012/0229159 | A1 | 9/2012 | Kim et al. |
| 2012/0280704 | A1 | 11/2012 | Lindsey et al. |
| 2013/0055184 | A1 | 2/2013 | Shroff |
| 2013/0224891 | A1 | 8/2013 | Takizawa |
| 2013/0304412 | A1 | 11/2013 | Richmond, II et al. |
| 2013/0342236 | A1 | 12/2013 | Song et al. |
| 2014/0125371 | A1 | 5/2014 | Chung et al. |
| 2014/0232424 | A1 | 8/2014 | Richmond, II et al. |
| 2015/0109011 | A1 | 4/2015 | Lindsey et al. |
| 2015/0137842 | A1 | 5/2015 | Murakami et al. |
| 2015/0204942 | A1 | 7/2015 | Scocchetti |
| 2015/0260793 | A1 | 9/2015 | Chen |
| 2015/0309114 | A1 | 10/2015 | Barabi et al. |
| 2015/0342023 | A1 | 11/2015 | Refai-ahmed et al. |
| 2016/0069951 | A1 | 3/2016 | Yamada |
| 2016/0103179 | A1 | 4/2016 | Lindsey et al. |
| 2017/0134587 | A1 | 5/2017 | Lawson et al. |
| 2017/0200660 | A1 | 7/2017 | Jovanovic |
| 2017/0294226 | A1 | 10/2017 | Yim |
| 2017/0358515 | A1 | 12/2017 | Murdock |
| 2018/0080981 | A1 | 3/2018 | Steps et al. |
| 2018/0182599 | A1 | 6/2018 | Stowell et al. |
| 2019/0019711 | A1 | 1/2019 | Tamura |
| 2019/0339303 | A1 | 11/2019 | Lindsey et al. |
| 2020/0033404 | A1 | 1/2020 | Hyakudomi et al. |
| 2020/0098653 | A1 | 3/2020 | Sasaki et al. |
| 2020/0300908 | A1 | 9/2020 | Steps et al. |
| 2020/0411410 | A1 | 12/2020 | Klein et al. |
| 2021/0063461 | A1 | 3/2021 | Basson et al. |
| 2022/0107358 | A1 | 4/2022 | Erickson, II et al. |
| 2022/0137121 | A1 | 5/2022 | Richmond, II et al. |
| 2024/0044971 | A1 | 2/2024 | Erickson, II |
| 2025/0138086 | A1 | 5/2025 | Erickson, II |
| 2025/0208202 | A1 | 6/2025 | Erickson, II |

FOREIGN PATENT DOCUMENTS

| | | | |
|---|---|---|---|
| CN | 1816895 | A | 8/2006 |
| CN | 1898572 | A | 1/2007 |
| CN | 100348982 | C | 11/2007 |
| CN | 100352029 | | 11/2007 |
| CN | 101084447 | A | 12/2007 |

(56) References Cited

FOREIGN PATENT DOCUMENTS

| | | | |
|---|---|---|---|
| CN | 101137947 | A | 3/2008 |
| CN | 100505201 | | 6/2009 |
| CN | 101675350 | A | 3/2010 |
| CN | 101750558 | A | 6/2010 |
| CN | 101952733 | A | 1/2011 |
| CN | 104865414 | A | 8/2015 |
| CN | 107799431 | A | 3/2018 |
| CN | 110383092 | A | 10/2019 |
| CN | 110383092 | B | 4/2022 |
| DE | 3914669 | A1 | 11/1989 |
| DE | 19781822.6 | | 9/2004 |
| EP | 0320660 | A2 | 6/1989 |
| EP | 0639777 | A1 | 8/1994 |
| EP | 2172968 | | 4/2010 |
| EP | 2772768 | A1 | 9/2014 |
| GB | 2285348 | A | 7/1995 |
| IT | MI2120121157 | A1 | 12/2013 |
| JP | 61-065319 | | 4/1986 |
| JP | 02-071540 | A | 3/1990 |
| JP | H03-162686 | A | 7/1991 |
| JP | H06-186283 | A | 7/1994 |
| JP | H06-347477 | A | 12/1994 |
| JP | 08-005666 | A | 1/1996 |
| JP | H08-005666 | A | 1/1996 |
| JP | H07-169806 | A | 7/1996 |
| JP | 08-340030 | A | 12/1996 |
| JP | H09-503577 | A | 4/1997 |
| JP | 09-115971 | | 5/1997 |
| JP | 10-116867 | A | 5/1998 |
| JP | 10-256325 | A | 9/1998 |
| JP | 1999-121569 | A | 4/1999 |
| JP | H11-121550 | A | 4/1999 |
| JP | 11-145216 | A | 5/1999 |
| JP | 11-145234 | A | 5/1999 |
| JP | H11-145225 | A | 5/1999 |
| JP | H11-284037 | A | 10/1999 |
| JP | 2000-164647 | A | 6/2000 |
| JP | 2000-0292443 | A | 10/2000 |
| JP | 2001-033516 | A | 2/2001 |
| JP | 2001-203244 | A | 7/2001 |
| JP | 2002-43381 | A | 2/2002 |
| JP | 2002-90426 | A | 3/2002 |
| JP | 2002-99360 | A | 4/2002 |
| JP | 2002-151558 | A | 5/2002 |
| JP | 2003-133563 | A | 5/2003 |
| JP | 2003-139816 | A | 5/2003 |
| JP | 2003-218254 | A | 7/2003 |
| JP | 2003-229506 | A | 8/2003 |
| JP | 2004-228312 | A | 8/2004 |
| JP | 2004-228313 | A | 8/2004 |
| JP | 2005-516226 | A | 6/2005 |
| JP | 2005-265786 | A | 9/2005 |
| JP | 2006-98064 | A | 4/2006 |
| JP | 2006-184044 | A | 7/2006 |
| JP | 2007-024702 | A | 2/2007 |
| JP | 2008-166306 | A | 7/2008 |
| JP | 2008-232667 | A | 10/2008 |
| JP | 2008-541415 | A | 11/2008 |
| JP | 2009-139192 | A | 6/2009 |
| JP | 2010-066091 | A | 3/2010 |
| JP | 5528617 | B1 | 4/2014 |
| JP | 2015-103552 | A | 6/2015 |
| JP | 2016-014614 | A | 1/2016 |
| JP | 6538808 | A1 | 6/2019 |
| JP | H11-121549 | A | 4/2024 |
| KR | 10-1994-0032588 | | 12/1994 |
| KR | 10-1999-0088373 | | 12/1999 |
| KR | 10-2005-0024395 | | 3/2005 |
| KR | 10-2007-0027524 | | 3/2007 |
| KR | 10-2008-0011213 | | 1/2008 |
| KR | 10-2012-0063576 | | 6/2012 |
| KR | 10-2016-0024676 | | 3/2016 |
| SU | 1247600 | A | 7/1986 |
| TW | 201632888 | A | 9/2003 |
| TW | 1225156 | B | 12/2004 |
| TW | 200521443 | | 7/2005 |
| TW | 200523562 | A | 7/2005 |
| TW | 200627573 | A | 8/2006 |
| TW | 200706888 | A | 2/2007 |
| TW | 1276815 | B | 3/2007 |
| TW | 200710412 | A | 3/2007 |
| TW | 200831932 | A | 8/2008 |
| TW | 201115164 | A1 | 5/2011 |
| TW | 201135253 | A1 | 10/2011 |
| TW | 201140105 | A1 | 11/2011 |
| TW | 201507556 | A | 2/2015 |
| TW | 201511658 | A | 3/2015 |
| WO | 95/02196 | A1 | 1/1995 |
| WO | 99/38209 | A2 | 7/1999 |
| WO | 2000073905 | A2 | 12/2000 |
| WO | 2001004641 | A2 | 1/2001 |
| WO | 2003065064 | A2 | 8/2003 |
| WO | 2004/003581 | A1 | 1/2004 |
| WO | 2004/008163 | | 1/2004 |
| WO | 2004095571 | A1 | 11/2004 |
| WO | 2005084328 | A2 | 9/2005 |
| WO | 2006/009061 | | 1/2006 |
| WO | 2006038257 | A1 | 4/2006 |
| WO | 2006/096361 | A2 | 9/2006 |
| WO | 2006113708 | A2 | 10/2006 |
| WO | 2006113708 | A3 | 10/2006 |
| WO | 2006/116767 | A1 | 11/2006 |
| WO | 2006119405 | A1 | 11/2006 |
| WO | 2007008790 | A2 | 1/2007 |
| WO | 2007010610 | A1 | 1/2007 |
| WO | 2008/124068 | A1 | 10/2008 |
| WO | 2011082183 | A2 | 7/2011 |
| WO | 2017210108 | A1 | 12/2017 |
| WO | 2018160557 | A1 | 9/2018 |
| WO | 2022076333 | A1 | 4/2022 |

OTHER PUBLICATIONS

"Extended European Search Report issued on Jan. 31, 2024", European Patent Application No. 23205767.9, (9 pages).
"First Office Action mailed Dec. 19, 2023 with English translation", Japanese Patent Application No. 2022-168114, (12 pages).
"First Office Action mailed Mar. 26, 2024 with English translation", Chinese Patent Application No. 202210265243.2, (7 pages).
"First Office Action mailed on Dec. 14, 2022", R.O.C. Patent Application No. 111137536, (4 pages).
"First Office Action mailed on Dec. 27, 2022 with English translation", Japanese Patent Application No. 2021-197754, (4 pages).
"First Office Action mailed on Feb. 7, 2022 with English Translation", Japanese Patent Application No. 2019-548053, (6 pages).
"First Office Action mailed on Jul. 10, 2020 with English translation", Chinese Patent Application No. 201780011541.6, (68 pages).
"First Office Action mailed on Jul. 21, 2021 with English translation", Chinese Patent Application No. 201880015746.6, (20 pages).
"First Office Action mailed on Jun. 15, 2022 with English translation", Korean Patent Application No. 10-2019-7028508, (10 pages).
"First Office Action mailed on Mar. 9, 2022 with English translation", R.O.C. Patent Application No. 110115369, (12 pages).
"First Office Action mailed on Nov. 12, 2020 with English translation", Japanese Patent Application No. 2018-535825, (7 pages).
"First Office Action mailed on Sep. 28, 2021 with English translation", R.O.C Patent Application No. 107107096, (11 pages).
"International Search Report and Written Opinion", International Patent Application No. PCT/US2021/053445, Feb. 14, 2022, (14 pages).
"International Search Report and Written Opinion dated Jan. 14, 2016", International PCT Application No. PCT/US15/56429 with International Filing Date of Oct. 20, 2015, (11 pages).
"International Search Report and Written Opinion mailed on Jun. 25, 2018", International PCT Patent Application No. PCT/US2018/019934, (15 pages).
"International Search Report and Written Opinion mailed on Mar. 30, 2017", International PCT Application No. PCT/US2017/012597 with International Filing Date of Jan. 6, 2017, (11 pages).

(56) References Cited

OTHER PUBLICATIONS

"Invitation to Pay Additional Fees mailed on Apr. 12, 2018", International PCT Patent Application No. PCT/US2018/019934, (3 pages).
"Japanese Office Action -mailed on Jul. 18, 2017 (with English translation)", Japanese Patent Application No. 2016-184497, (9 pages).
"Non Final Office Action mailed on Apr. 9, 2021", U.S. Appl. No. 16/576,555, (17 pages).
"Non Final Office Action mailed on Aug. 19, 2020", U.S. Appl. No. 16/899,246, (13 pages).
"Non Final Office Action mailed on Dec. 11, 2019", U.S. Appl. No. 16/172,249, (11 pages).
"Non Final Office Action mailed on Feb. 9, 2018", U.S. Appl. No. 15/823,290, (7 pages).
"Non Final Office Action mailed on Jun. 29, 2021", U.S. Appl. No. 16/831,485, (14 pages).
"Non Final Office Action mailed on Sep. 20, 2022", U.S. Appl. No. 17/253,646, (8 pages).
"Notice of Allowance mailed on Jul. 18, 2023", U.S. Appl. No. 18/176,965, (10 pages).
"Notice of Grounds for Rejection mailed on Jun. 15, 2017 (with English Translation)", Korean Patent Application No. 10-2017-7004733, (14 pages).
"Notice of Reasons for Rejection mailed Oct. 15, 2018 with English translation", Japanese Patent Application No. 2017-228718, (6 pages).
"Office Action and Search Report mailed on Mar. 12, 2024", Singapore Patent Application No. 11202302449Y, (11 pages).
"Office Action mailed on Apr. 13, 2023 with English translation", Japanese Patent Application No. 2022 045659, (3 pages).
"Office Action mailed on Apr. 21, 2024 with English translation", Korean Patent Application No. 10-2018-7022771, (24 Pages).
"Office Action mailed on Feb. 27, 2020 with English Translation", R.O.C. Patent Application No. 106100392, (3 pages).
"Office Action mailed on Oct. 26, 2023 with English translation", Korean Patent Application No. 10-2023-7003482, (17 pages).
"Official Notification mailed on Sep. 6, 2021 with English translation", Japanese Patent Application No. 2020-197424, (6 pages).
"Search Report and Written Opinion", Singapore Patent Application No. 10202108629Y mailed on Feb. 24, 2022, (9 pages).
"Second Office Action mailed on Aug. 23, 2021 with English Translation", Japanese Patent Application No. 2018-535825, (5 pages).
"Second Office Action mailed on May 23, 2023", R.O.C. Patent Application No. 111137536, (8 pages).
"Extended European Search Report issued on May 12, 2025", European Patent Application No. 25150699.4, (10 pages).
"Extended European Search Report issued on May 8, 2025", European Patent Application No. 24220445.1, (8 pages).
"International Search Report and Written Opinion mailed on Apr. 7, 2025", International Application No. PCT/US2025/014825, (10 pages).
"Non Final Office Action mailed on Nov. 22, 2024", U.S. Appl. No. 17/813,298, (23 pages).
"Non Final Office Action mailed on Nov. 29, 2024", U.S. Appl. No. 18/825,970, (15 pages).
"Notice of Allowance mailed on Nov. 22, 2024", U.S. Appl. No. 18/825,962, (9 pages).
"Office Action mailed Mar. 23, 2025 with English translation", Korean Patent Application No. 10-2025-7001230, (21 pages).
"Office Action mailed on Feb. 27, 2025 with English translation", Japanese Patent Application No. 2024-232440, (6 pages).
"Office Action mailed on Feb. 6, 2025", Singapore Application No. 10202260021Y, (12 pages).
"Office Action mailed on Feb. 6, 2025", Singapore Patent Application No. 10202402436P, (13 pages).
"Office Action mailed on Feb. 6, 2025", Singapore Patent Application No. 10202402437Q, (13 pages).
"Office Action mailed on Feb. 6, 2025", Singapore Patent Application No. 10202402438S, (13 pages).
"Office Action mailed on Feb. 6, 2025", Singapore Patent Application No. 10202402435R, (14 pages).
"Office Action mailed on Jan. 15, 2025", Taiwanese Patent Application No. 110137225, (5 pages).
"Office Action mailed on Jun. 26, 2025 with English translation", Japanese Patent Application No. 2024-232440, (4 pages).
"Office Action mailed on Mar. 23, 2025 with English translation", Korean Patent Application No. 10-2023-7015433, (17 pages).
"Office Action mailed on Nov. 7, 2024 with English translation", Japanese Patent Application No. 2023-521543, (9 pages).
"Office Action, Search Report and Written Opinion mailed on Sep. 5, 2025", Singapore Patent Application No. 10202403929R, (11 pages).
"Extended European Search Report mailed on Sep. 30, 2024", European Patent Application No. 21878311.6, (9 pages).
"International Search Report and Written Opinion mailed on Aug. 2, 2024", International PCT Patent Application No. PCT/US2023/086080, (15 pages).
"Notice of Allowance mailed on Jul. 30, 2024", U.S. Appl. No. 18/485,716, (10 pages).
"Office Action mailed on Aug. 27, 2024 with English translation", Japanese Patent Application No. 2023-172760, (12 Pages).
"Office Action mailed on Aug. 6, 2024", Japanese Patent Application No. 2023-131868, (7 pages).
"Second Office Action mailed on Aug. 29, 2024 with English translation", Chinese Patent Application No. 202210265243.2, (22 pages).
"Final Office Action with English translation mailed on Sep. 18, 2025", Japanese Patent Application No. 2024-135246, (8 pages).
"Office Action mailed on Sep. 26, 2025 with English translation", Chinese Patent Application No. 202510340461.1, (12 pages).
"Extended European Search Report issued on Dec. 17, 2025", European Patent Application No. 25199086.7, (8 pages).
"Extended European Search Report issued on Jan. 14, 2026", European Patent Application No. 25208596.4, (8 pages).
"Extended European Search Report issued on Jan. 14, 2026", European Patent Application No. 25199087.5, (8 pages).
"Extended European Search Report issued on Jan. 14, 2026", European Patent Application No. 25208593.1, (8 pages).
"Extended European Search Report issued on Jan. 14, 2026", European Patent Application No. 25212936.6, (7 pages).
"Office Action mailed on Dec. 22, 2025 with English translation", Japanese Patent Application No. 2024-194244, (14 pages).
"Extended European Search Report issued on Feb. 26, 2026", European Patent Application No. 25221492.9, (9 pages).
"Notice of Acceptance of Request for Invalidation of Chinese Patent Application No. 200880018734.5 mailed on Feb. 25, 2026", Chinese Patent Application No. 200880018734.5, (65 pages).
"Office Action mailed on Mar. 20, 2026 with English translation", Korean Patent Application No. 10-2025-7026390, (24 pages).
"Office Action mailed on Mar. 20, 2026 with English translation", Korean Patent Application No. 10-2025-7026391, (12 pages).
"Office Action mailed on Mar. 23, 2026 with English translation", Korean Patent Application No. 10-2025-7026394, (14 pages).
"Notice of Reasons for Rejection mailed Aug. 17, 2020 with English translation", Japanese Patent Application No. 2019-106294, (9 pages).
"Notice of Allowance mailed on Jul. 17, 2024", U.S. Appl. No. 18/523,604, (8 pages).
"Non Final Office Action mailed on Oct. 8, 2024", U.S. Appl. No. 18/602,925, (9 pages).
"Notification of Acceptance of Request for Invalidation with English Translation mailed on Nov. 15, 2024", Chinese Patent Application No. 2013101595734, (147 pages).
Ivy, et al., "Sacrificial Metal Wafer Level Burn-In KGD", 2000 Proceedings. 50th Electronic Components and Technology Conference (Cat. No. 00CH37070). May 21-24, 2000, (6 pages).
"Extended European Search Report issued on May 13, 2026", European Patent Application No. 26155754.0, (9 pages).
"First Office Action mailed on May 22, 2026", R.O.C. Application No. 114149024, (6 pages).

(56) References Cited

OTHER PUBLICATIONS

"Office Action mailed on May 25, 2026", Japanese Patent Application No. 2025-070305, (6 pages).
"Office Action mailed May 25, 2026", Japanese Patent Application No. 2025-070306, (4 pages).
"Office Action mailed on May 21, 2026", R.O.C. Patent Application No. 114149023, (7 pages).
"Office Action mailed on May 22, 2026", R.O.C. Application No. 114149025, (7 pages).
"Office Action mailed on May 22, 2026", R.O.CApplication No. 114149026, (7 pages).
"Office Action mailed on May 22, 2026", R.O.C. Patent Application No. 114149027, (6 pages).
"Non Final Office Action mailed on Jun. 11, 2026", U.S. Appl. No. 18/947,530, (10 pages).
"Notice of Allowance", U.S. Appl. No. 18/961,272,.
"Notice of Allowance mailed on Jun. 17, 2026", U.S. Appl. No. 18/961,287, (10 pages).
"Office Action mailed on Jul. 6, 2026 with English translation", Koreana Patent Application No. 10-2025-7025667, (19 pages).

METHOD AND SYSTEM FOR THERMAL CONTROL OF DEVICES IN AN ELECTRONICS TESTER

CROSS-REFERENCE TO RELATED APPLICATIONS

This application is a continuation of U.S. Patent Application No: U.S. patent application Ser. No. 17/532,298, filed on Nov. 22, 2021, which is a divisional of U.S. patent application Ser. No. 16/576,555, filed on Sep. 19, 2019, now U.S. Pat. No. 11,209,497, which is a divisional of U.S. patent application Ser. No. 15/400,771, filed on Jan. 6, 2017, now U.S. Pat. No. 10,466,292, which claims priority from U.S. Provisional Patent Application No. 62/276,746, filed on Jan. 8, 2016, each of which is incorporated herein by reference in their entirety.

BACKGROUND OF THE INVENTION

1). Field of the Invention

This invention relates to a tester apparatus that is used for testing microelectronic circuits.

2). Discussion of Related Art

Microelectronic circuits are usually fabricated in and on semiconductor wafers. Such a wafer is subsequently “singulated” or “diced” into individual dies. Such a die is typically mounted to a supporting substrate for purposes of providing rigidity thereto and for electronic communication with an integrated or microelectronic circuit of the die. Final packaging may include encapsulation of the die and the resulting package can then be shipped to a customer.

It is required that the die or the package be tested before being shipped to the customer. Ideally, the die should be tested at an early stage for purposes of identifying defects that occur during early stage manufacture. Wafer level testing may be accomplished by providing a handler and a contactor with contacts and then using the handler to move the wafer so that contacts on the wafer make contact with the contacts on the contactor. Power and electronic signals can then be provided through the contactor to and from microelectronic circuits formed in the wafer.

According to various embodiments a wafer includes a substrate such as a silicon substrate or a printed circuit board and one or more devices fabricated in the substrate or mounted to the substrate.

Alternatively, the wafer can be located within a portable cartridge having an electric interface and a thermal chuck. Power and signals can be provided through the electric interface to and from the wafer while a temperature of the wafer is thermally controlled by heating or cooling the thermal chuck.

SUMMARY OF THE INVENTION

The invention provides a tester apparatus including a frame, a plurality of slot assemblies, each slot assembly including a slot assembly body mounted to the frame, a holder mounted to the slot assembly body and forming a testing station for placement of a respective wafer, the respective wafer having at least one microelectronic device, a plurality of electrical conductors and a temperature detector in proximity to the respective wafer to detect a temperature of the respective wafer, at least one temperature modification device, which, when operated causes a transfer of heat to or from the wafers, at least one thermal controller that controls the transfer of heat based on the temperatures of the wafers detected by the temperature detectors, a power supply connected through the electrical conductors to the wafers in the testing stations and providing at least power to each microelectronic device and a tester connected through the electrical conductors to the wafers and measuring a performance of the microelectronic device.

The invention further provides a method of testing microelectronic devices including placing a respective wafer of a plurality of wafers, each having at least one microelectronic device, in a respective testing station provided by a respective holder of a respective slot assembly mounted to a frame, detecting a respective temperature of the respective wafer with a respective temperature detector in proximity to the respective wafer, transferring of heat to or from the wafers, controlling the transfer of heat based on the temperatures of the wafers detected by the temperature detectors and testing the microelectronic devices by providing at least power to each microelectronic device and measuring a performance of the microelectronic device.

The invention also provides a tester apparatus including a frame defining at least a first closed loop air path, at least a first fan located in the first closed loop air path to recirculate air through the first closed loop air path, a plurality of slot assemblies, each slot assembly including a slot assembly body mounted to the frame, a holder mounted to the slot assembly body and forming a testing station for placement of a respective wafer, the respective wafer having at least one microelectronic device and being held in the first closed loop air path and a plurality of electrical conductors, a temperature modification device mounted to the frame in the first closed loop air path, which, when operated causes a transfer of heat between the air in the first closed loop air path and the temperature modification device in the first closed loop air path, at least one temperature detector detecting a temperature, a thermal controller that controls the transfer of heat based on the temperature, a power supply connected through the electrical conductors to the wafers in the testing stations and providing at least power to each microelectronic device and a tester connected through the electrical conductors to the wafers and measuring a performance of the microelectronic device.

The invention further provides a method of testing microelectronic devices including placing a respective wafer of a plurality of wafers, each having at least one microelectronic device, in a respective testing station provided by a respective holder of a respective slot assembly mounted to a frame, the wafers being held in a first closed loop air path defined by the frame, operating at least a first fan located in the first closed loop air path to recirculate air through the first closed loop air path, transferring heat between at least one temperature modification device mounted to the frame in the first closed loop air path and the air in the first closed loop air path, detecting a temperature, controlling the transfer of heat based on the temperature and testing the microelectronic devices by providing at least power to each microelectronic device and measuring a performance of the microelectronic device.

The invention also provides a tester apparatus including a frame, a plurality of slot assemblies, each slot assembly including a slot assembly body mounted to the frame, a holder mounted to the slot assembly body and forming a testing station for placement of a respective wafer, the respective wafer having at least one microelectronic device, a plurality of electrical conductors and a temperature detector in proximity to the respective wafer to detect a temperature of the respective wafer, at least one temperature modification device, which, when operated causes a transfer of heat to or from the wafers and a tester connected through the electrical conductors to the wafers in the testing stations to test the microelectronic devices by providing at least power to each microelectronic device and measuring a performance of the microelectronic device, wherein at least one of the conductors of a first of the slot assemblies is connectable between a first of the wafers and the power while transferring heat to or from a second of the wafers that is connected to the power.

The invention further provides a method of testing microelectronic devices including placing a respective wafer of a plurality of wafers, each having at least one microelectronic device, in a respective testing station provided by a respective holder of a respective slot assembly mounted to a frame, detecting a respective temperature of the respective wafer with a respective a temperature detector in proximity to the respective wafer, transferring of heat to or from the wafers, testing the microelectronic devices by providing at least power to each microelectronic device and measuring a performance of the microelectronic device and connecting at least one of the conductors of a first of the slot assemblies between a first of the wafers and the power while transferring heat to or from a second of the wafers that is connected to the power.

BRIEF DESCRIPTION OF THE DRAWINGS

The invention is further described by way of examples with reference to the accompanying drawings, wherein.

DETAILED DESCRIPTION OF THE INVENTION

Figure 1:
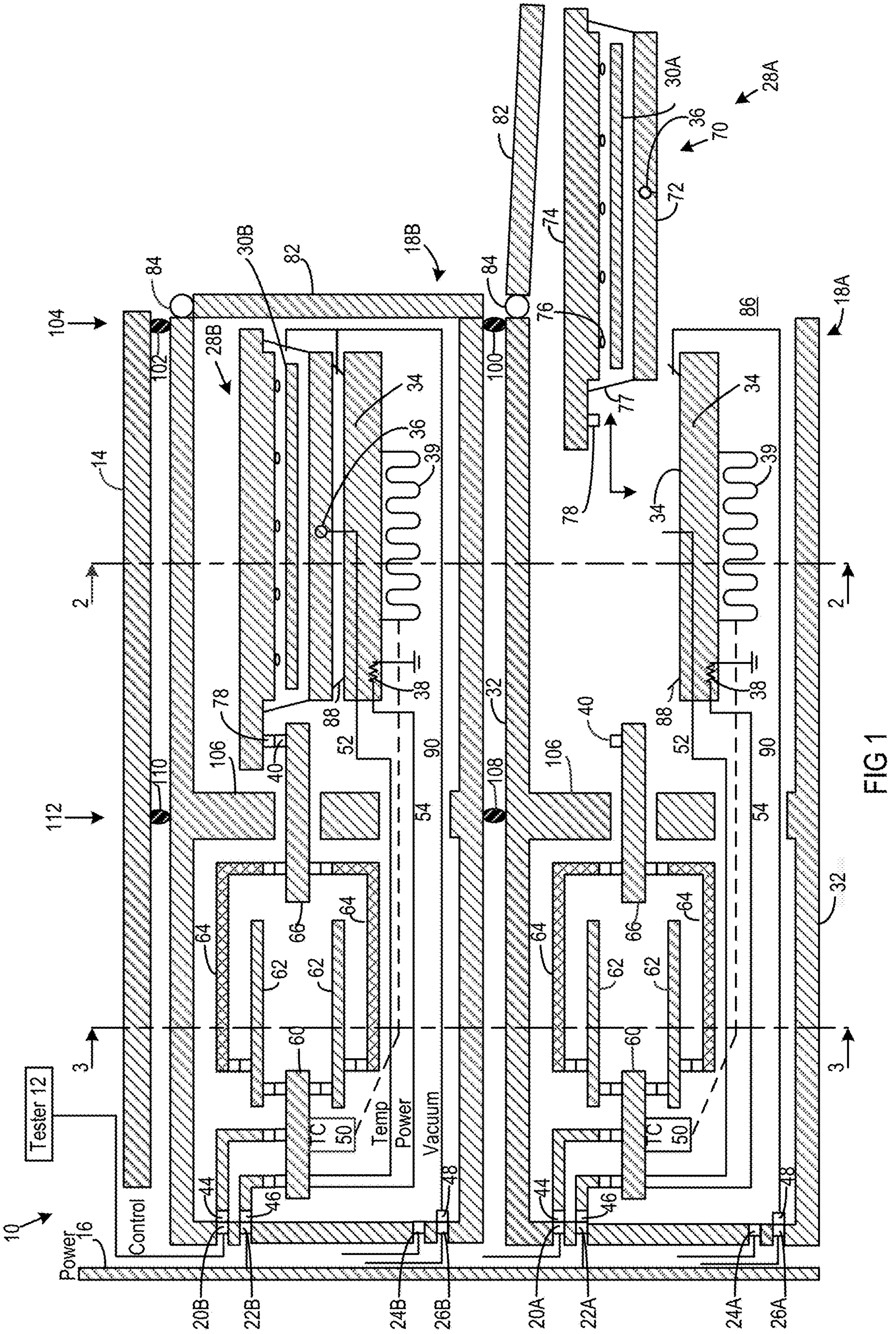
FIG. 1 is a cross-sectional side view of a tester apparatus having slot assemblies according to one embodiment of the invention.

FIG. 1 of the accompanying drawings illustrates a tester apparatus 10, according to an embodiment of the invention, that includes a tester 12, a frame 14, a power bus 16, first and second slot assemblies 18A and 18B, first and second tester interfaces 20A and 20B, first and second power interfaces 22A and 22B, first and second pressurized air interfaces 24A and 24B, first and second vacuum interfaces 26A and 26B, first and second cartridges 28A and 28B, and first and second wafers 30A and 30B.

The slot assembly 18A includes a slot assembly body 32, a thermal chuck 34, a temperature detector 36, a temperature modification device in the form of a heating element 38, a cooling element 39, a first slot assembly interface 40, and a plurality of second slot assembly interfaces, including a control interface 44, a power interface 46 and a vacuum interface 48.

The first slot assembly interface 40 is located within the slot assembly body 32 and is mounted to the slot assembly body 32. The second interfaces in the form of the control interface 44, the power interface 46 and the vacuum interface 48 are mounted in a left wall of the slot assembly body 32 mounted to the frame 14.

The slot assembly 18A is insertable into and is removable from the frame 14. When the slot assembly 18A is inserted into the frame 14, the tester interface 20A, the power interface 22A and the first vacuum interface 26A connect to the control interface 44, the power interface 46 and the vacuum interface 48 respectively. When the slot assembly 18A is removed from the frame 14, the tester interface 20A, power interface 22A and first vacuum interface 26A disconnect from the control interface 44, power interface 46 and vacuum interface 48.

The slot assembly 18A includes a motherboard 60 having test electronics, a plurality of channel module boards 62 having test electronics, flexible connecters 64, and a connection board 66. The control interface 44 and the power interface 46 are connected to the motherboard 60 and a thermal controller 50 is mounted to the motherboard 60. The channel module boards 62 are electrically connected to the motherboard 60. The flexible connectors 64 connect the channel module boards 62 to the connection board 66. Control functionality is provided through electrical conductors connecting the control interface 44 to the motherboard 60. Power is provided through the power interface 46 to the motherboard 60. Both power and control are provided from the motherboard 60 through conductors to the channel module boards 62. The flexible connectors 64 provide conductors that connect the channel module boards 62 to the connection board 66. The connection board 66 includes a conductor that connects the flexible connectors 64 to the first slot assembly interface 40. This first slot assembly interface 40 is thus connected through various conductors to the control interface 44 and power interface 46 so that power and control can be provided via the control interface 44 and power interface 46 to the first slot assembly interface 40.

The second slot assembly 18B includes similar components to the first slot assembly 18A and like reference numerals indicate like components. The second slot assembly 18B is inserted into the frame 14 so that the control interface 44, power interface 46 and vacuum interface 48 of the second slot assembly 18B are connected to the tester interface 20B, power interface 22B and second vacuum interface 26B, respectively.

The cartridge 28A includes a cartridge body 70 formed by a thin chuck 72 and a backing board 74. A temperature detector 36 is located in the thin chuck 72. The wafer 30A has a plurality of microelectronic devices formed therein. The wafer 30A is inserted into the cartridge body 70 between the thin chuck 72 and backing board 74. Cartridge contacts 76 make contact with respective contacts (not shown) on the wafer 30A. The cartridge 28A further includes a cartridge interface 78 on the backing board 74. Conductors in the backing board 74 connect the cartridge interface 78 to the cartridge contacts 76.

The cartridge 28A has a seal 77 connected between the backing board 74 and the thin chuck 72. A vacuum is applied to an area defined by the seal 77, backing board 74 and the thin chuck 72. The vacuum keeps the cartridge 28A together and ensures proper contact between the cartridge contacts 76 and the contacts on the wafer 30A. The temperature detector 36 is in proximity to the wafer 30A and therefore close enough to the wafer 30A to detect a temperature of the wafer 30A or within five degrees Celsius, preferably within one of two degrees Celsius of the wafer 30A.

The slot assembly 18A further has a door 82 connected to the slot assembly body 32 by a hinge 84. When the door 82 is rotated into an open position, the cartridge 28A can be inserted through a door opening 86 into the slot assembly body 32. The cartridge 28A is then lowered onto the thermal chuck 34 and the door 82 is closed. The slot assembly 18A further has a seal 88 that is located between the thermal chuck 34 and the thin chuck 72. A vacuum is applied through the vacuum interface 48 and a vacuum line 90 to an area defined by the seal 88, thermal chuck 34 and thin chuck 72. The thermal chuck 34 then essentially forms a holder having a testing station for a wafer. The thermal chuck 34 is mounted to the slot assembly body 32. A good thermal connection is thereby provided between the thermal chuck 34 and the thin chuck 72. When heat is created by the heating element 38, the heat conducts through the thermal chuck 34 and the thin chuck 72 to reach the wafer 30A.

The cartridge interface 78 engages with the first slot assembly interface 40. Power and signals are provided via the first slot assembly interface 40, cartridge interface 78 and cartridge contacts 76 to the wafer 30A. A performance of devices within the wafer 30A is measured through the cartridge contacts 76, cartridge interface 78 and first slot assembly interface 40.

The door 82 of the slot assembly 18B is shown in a closed position. A front seal 100 is mounted on an upper surface of the slot assembly 18A and seals with a lower surface of the slot assembly 18B. A front seal 102 is mounted to an upper surface of the slot assembly 18B and seals with a lower surface of the frame 14. A continuous sealed front wall 104 is provided by the doors 82 of the slot assemblies 18A and 18B and the front seals 100 and 102.

The slot assembly 18A further includes a thermal controller 50. The temperature detector 36 is connected through a temperature feedback line 52 to the thermal controller 50. Power is provided through the power interface 46 and a power line 54 to the heating element 38 so that the heating element 38 heats up. The heating element 38 then heats the thermal chuck 34 and the wafer 30A on the thermal chuck 34. The cooling element 39 is located against the heating element 38 and may for example be a cooling element body with a liquid flowing therethrough at a controllable rate to control the amount of heat that is transferred away from the wafer and the thermal chuck 34. The heating element 38 and cooling element 39 are controlled by the thermal controller 50 based on the temperature detected by the temperature detector 36.

The slot assembly 18A includes a separator seal 108 mounted to an upper surface of the slot assembly body 32 above the internal wall 106 thereof. The separator seal 108 seals with a lower surface of the slot assembly 18B. The slot assembly 18B has a separator seal 110 mounted to an upper surface of the slot assembly body 32 thereof. The separator seal 108 seals with a lower surface of the frame 14. A continuous sealed separator wall 112 is provided by the internal walls 106 of the slot assemblies 18A and 18B and the separator seals 108 and 110.

Figure 2:
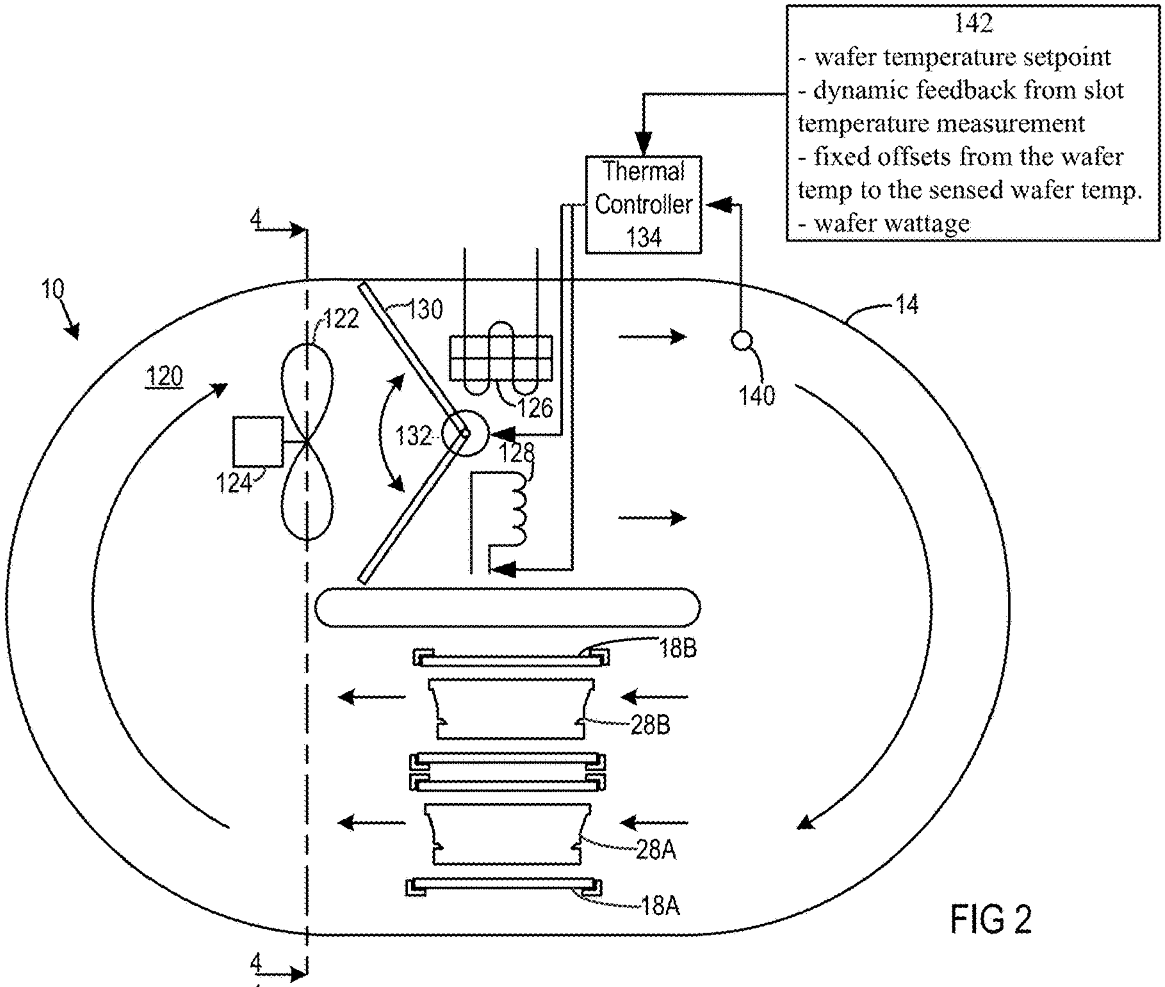
FIG. 2 is a cross-sectional side view of the tester apparatus on 2-2 in FIG. 1.

FIG. 2 illustrates the tester apparatus 10 on 2-2 in FIG. 1. The frame 14 defines a first closed loop air path 120. Air inlet and outlet openings (not shown) can be opened to change the first closed loop air path 120 into an open air path wherein air at room temperature passes through the frame 14 without being recirculated. A closed loop path is particularly useful in a clean room environment because it results in less particulate material being released into the air.

The tester apparatus 10 further includes a first fan 122, a first fan motor 124, a temperature modification device in the form of a water cooler 126, a temperature modification device in the form of an electric heater 128, a damper 130, a damper actuator 132 and a thermal controller 134.

The first fan 122 and first fan motor 124 are mounted in an upper portion of the first closed loop air path 120. The damper 130 is mounted to the frame 14 for pivotal movement between an up position and a down position. The water cooler 126 and electric heater 128 are mounted to the frame 14 within an upper portion of the first closed loop air path 120.

The damper actuator 132 is connected to the damper 130 to rotate the damper between the up position and the down position. The thermal controller 134 controls operation of the damper actuator 132 and current provided to the electric heater 128. The thermal controller 134 receives an input from an air temperature measurement device 140 located within the first closed loop air path 120. As represented by block 142 an air temperature set point that is set by the thermal controller 134 is a function of all of the following:

1) wafer temperature set point (programmed by the user);
2) dynamic feedback from slot temperature measurement by the temperature detectors 36 in FIG. 1;
3) fixed offsets from the wafer temperature to the sensed wafer temp, which are primarily calibratable thermocouple variations and temperature drops that can be a function of the wafer wattage; and
4) wafer wattage.

The cartridges 28A and 28B are positioned with the slot assemblies 18A and 18B and are within a lower half of the first closed loop air path 120.

In use, current is provided to the first fan motor 124. The first fan motor 124 rotates the first fan 122. The first fan 122 recirculates air in a clockwise direction through the first closed loop air path 120.

The thermal controller 134 receives the temperature from the temperature measurement device 140. The thermal controller 134 is set to maintain the temperature of the air in the first closed loop air path 120 at a predetermined setting. If the air has to be heated, the thermal controller 134 activates the damper actuator 132 to rotate the damper 130 into the up position. Air is deflected away from the water cooler 126 towards the electric heater 128. The electric heater 128 then heats the air.

If the air within the first closed loop air path 120 has to be cooled, the thermal controller 134 reduces a current on the electric heater 128 and operates the damper actuator 132 to rotate the damper 130 into the down position. In the down position, the damper 130 deflects air away from the electric heater 128 so that the majority of the air flows over a heat exchanger of the water cooler 126. The water cooler 126 then cools the air. The air then flows through the slot assemblies 18A and 18B over the cartridges 28A or 28B. The cartridges 28A or 28B are then heated or cooled by the air through convection.

Figure 3:
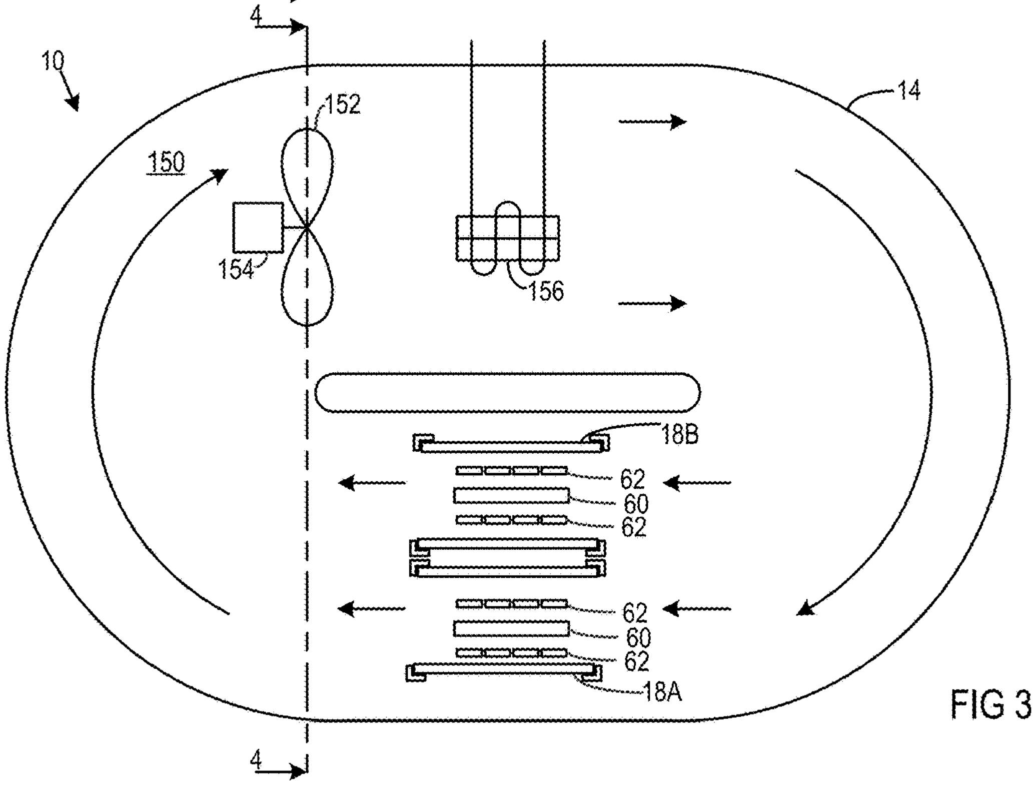
FIG. 3 is a cross-sectional side view of the tester apparatus on 3-3 in FIG. 1.

FIG. 3 shows the tester apparatus 10 on 3-3 in FIG. 1. The frame 14 defines a second closed loop air path 150. The tester apparatus 10 further includes a second fan 152, a second fan motor 154 and a temperature modification device in the form of a water cooler 156. No electric heater or damper is provided as in FIG. 2. Air inlet and outlet openings (not shown) can be opened to change the first closed loop air path 150 into an open air path wherein air at room temperature passes through the frame 14 without being recirculated.

A closed loop path is particularly useful in a clean room environment because it results in less particulate material being released into the air. The second fan 152 and second fan motor 154 are located in an upper portion of the second closed loop air path 150. The water cooler 156 is located slightly downstream from the second fan 152 within the second closed loop air path 150. The motherboard 60 and channel module boards 62 that form a part of the slot assemblies 18A and 18B are located within a lower half of the second closed loop air path 150.

In use, electric current is provided to the second fan motor 154, which rotates the second fan 152. The second fan 152 then recirculates air in a clockwise direction through the second closed loop air path 150. The air is cooled by the water cooler 156. The cooled air then passes over the motherboard 60 and channel module boards 62 so that heat transfers from the motherboard 60 and channel module boards 62 to the air through convection.

Air recirculating through the first closed loop air path 120 in FIG. 1 is kept separate from air in the second closed loop air path 150 in FIG. 3 by the continuous sealed separator wall 112 shown in FIG. 1. The continuous sealed front wall 104 shown in FIG. 1 prevents air from escaping out of the first closed loop air path 120.

Figure 4:
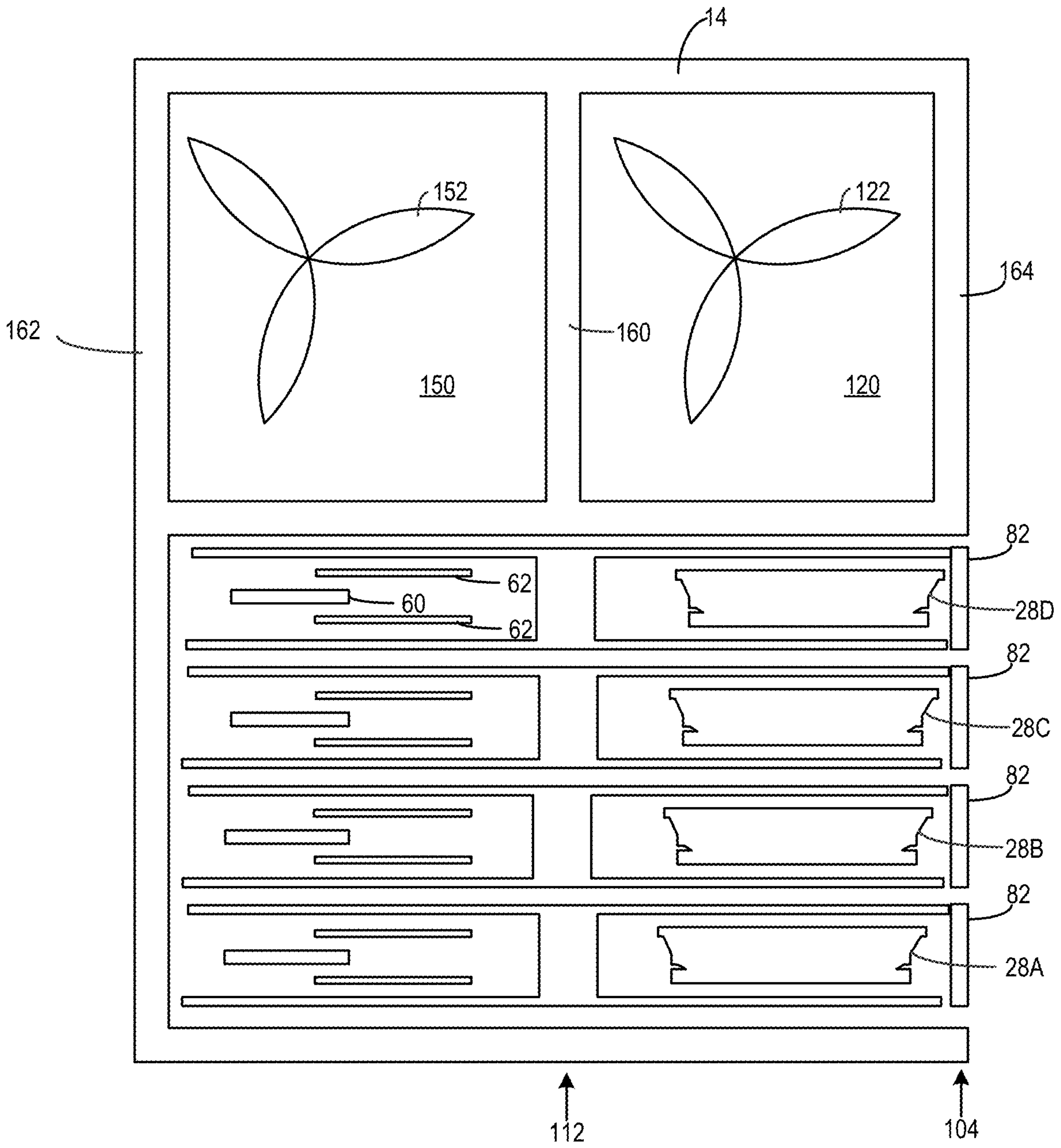
FIG. 4 is a cross-sectional side view of the tester apparatus on 4-4 in FIGS. 2 and 3.

As shown in FIG. 4, a plenum 160 separates the first closed loop air path 120 from the second closed loop air path 150 in all areas except those provided by the continuous sealed separator wall 112. The frame 14 has left and right walls 162 and 164 that further define the closed loop air paths 120 and 150.

Figure 5A:
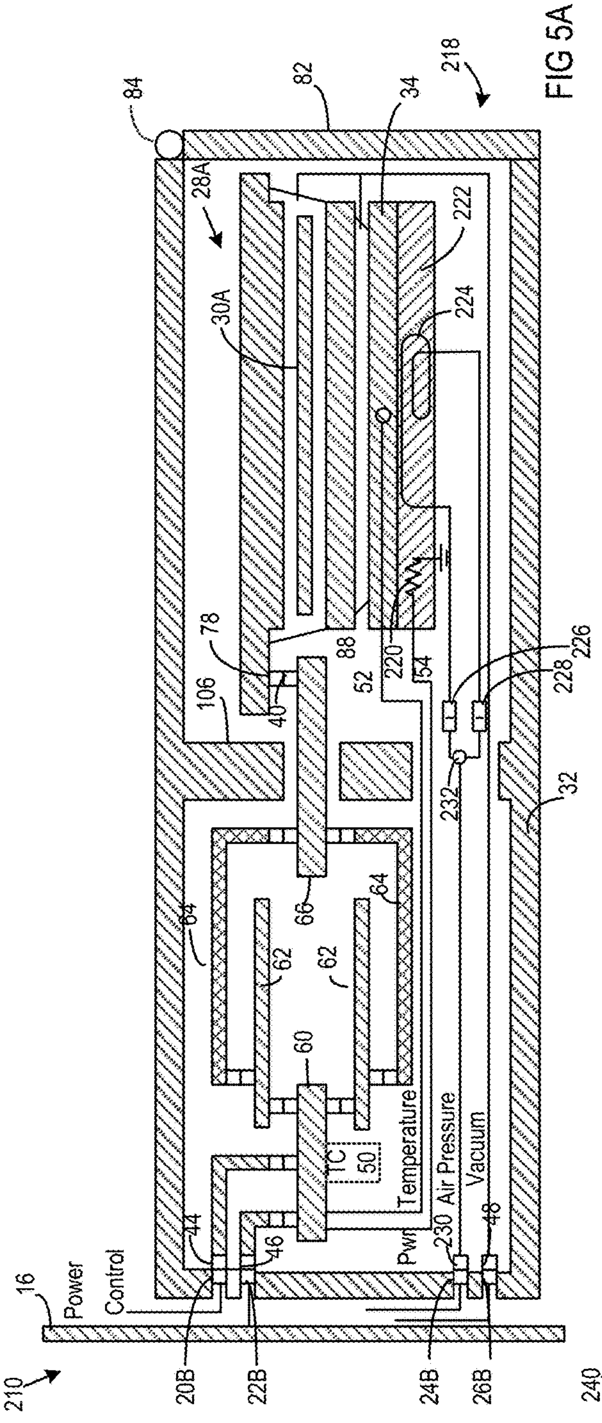
FIG. 5A is a cross-sectional side view of a tester apparatus having a slot assembly according to another embodiment of the invention.

FIG. 5A illustrates a tester apparatus 210 having a slot assembly 218 according to an alternate embodiment of the invention. The slot assembly 218 includes a heating resistor 220 that operates in a similar manner to the heating element 38 shown in FIG. 1. The heating resistor 220 is located within a thermal chuck 222. The thermal chuck 222 has a thermal fluid passage 224 formed therein. The thermal fluid passage 224 holds a thermal fluid. The thermal fluid is preferably a liquid as opposed to a gas because liquid is not compressible and heat convects faster to or from a liquid. Different thermal fluids are used for different applications with oil being used for applications where temperatures are the highest.

Opposing ends of the thermal fluid passage 224 are connected to first and second cylinders 226 and 228. The slot assembly 218 includes an air pressure interface 230 and a pneumatic switch 232. The air pressure interface 230 connects to the pressurized air interface 24A on the frame 14 of the tester apparatus 10.

Air pressure at above ambient pressure is provided through the pneumatic switch 232 to either the first cylinder 226 or the second cylinder 228. When the pressurized air is provided to the first cylinder 226, the first cylinder 226 acts as a thermal fluid actuator that pushes the thermal fluid in one direction through the thermal fluid passage 224. The second cylinder 228 then receives the thermal fluid. When air pressure is provided through the pneumatic switch 232 to the second cylinder 228, the second cylinder 228 pushes the thermal fluid in opposite direction through the thermal fluid passage 224 and the first cylinder 226 receives the thermal fluid. The pneumatic switch 232 continually alternates its position so that thermal fluid continually alternates its direction of movement through the thermal fluid passage 224. The heating resistor 220 serves as a heater that is mounted in a position to heat the thermal chuck 222, which heats the thermal fluid. By recirculating the thermal fluid through the thermal fluid passage 224, a more uniform distribution of heat is provided by the thermal chuck 222 to the thermal chuck 34 and ultimately to the wafer 30A.

Figure 5B:
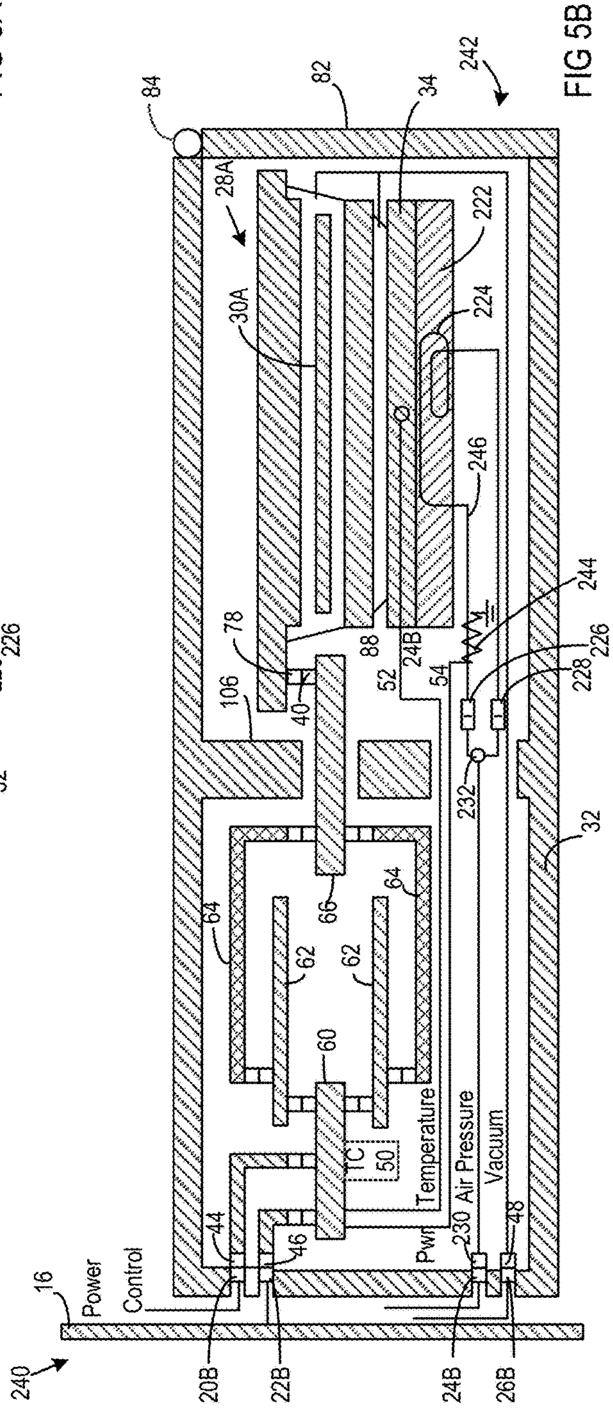
FIGS. 5B and 5C are cross-sectional side views of a tester apparatus having a slot assembly according to a further embodiment of the invention.

FIG. 5B illustrates a tester apparatus 240 having a slot assembly 242 according to a further embodiment of the invention. The slot assembly 242 has a thermal fluid passage 224, cylinders 226 and 228, a pneumatic switch 232 and an air pressure interface 230 as in the embodiment of FIG. 5A. The heating resistor 220 in the embodiment of FIG. 5A is replaced with a heating resistor 244 located outside the thermal chuck 222 close to or around a line 246 connecting the first cylinder 226 to the thermal fluid passage 224. The heating resistor 244 is used to continuously heat the thermal fluid within the line 246. A more direct heating of the thermal fluid is provided in the embodiment of FIG. 5B than in the embodiment of FIG. 5A.

Figure 5C:
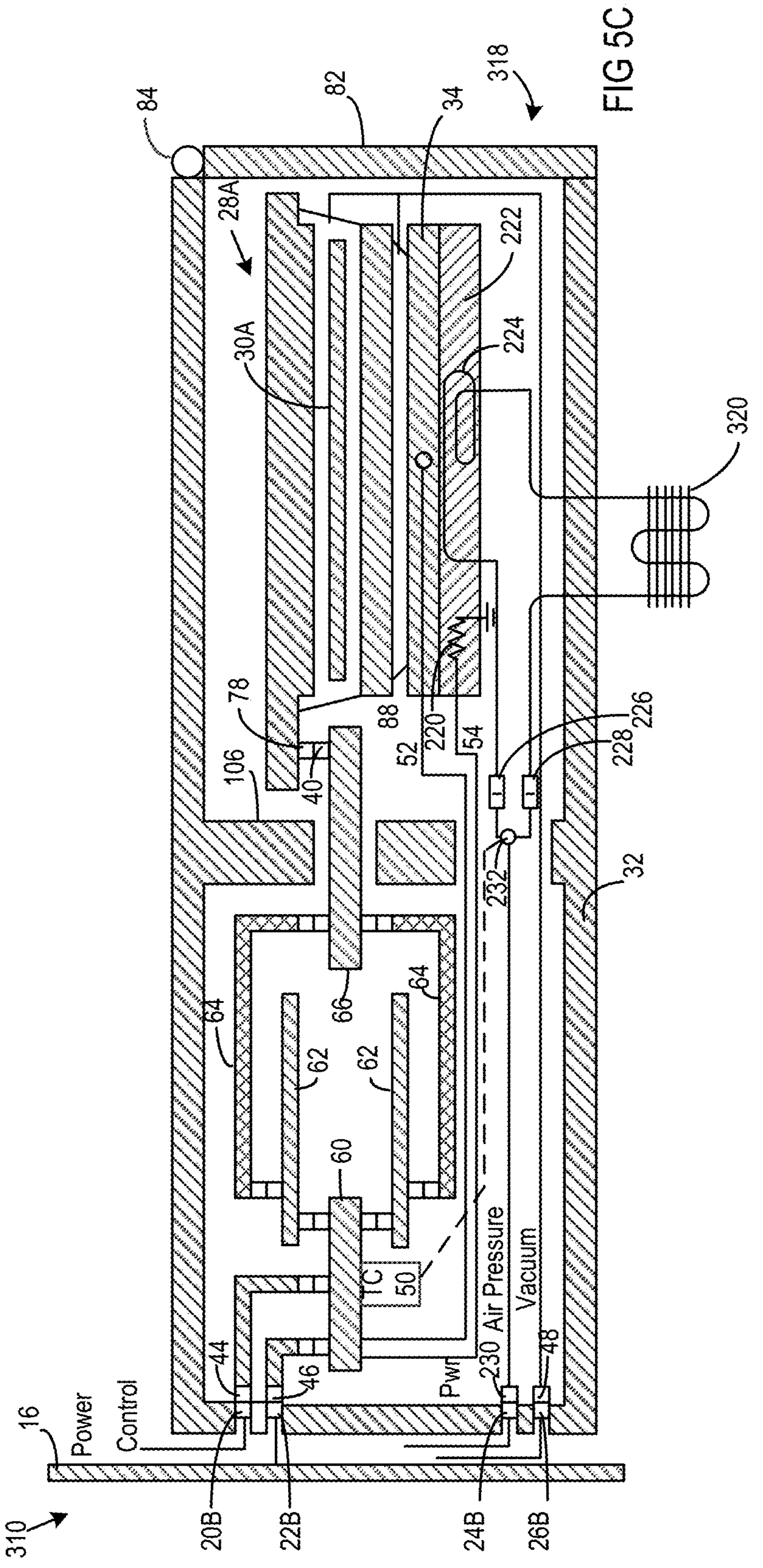

FIG. 5C illustrates a tester apparatus 340 with a slot assembly 318 that is similar to the slot assembly 218 of FIG. 5A except for the inclusion of a cooling element 320. The cooling element is in-line with the thermal fluid passage 224. In use, heat transfers to thermal fluid in the thermal fluid passage 224. The heated thermal fluid then flows to the cooling element 320. The cooling element is located in the first closed loop air path 120 in FIG. 2 so that the heat conducts through the cooling element 320 and then convects to the air in the first closed loop air path 120. The cooled thermal fluid then flows through the first and second cylinders 226 and 228 to the thermal fluid passage 224.

Figure 6A:
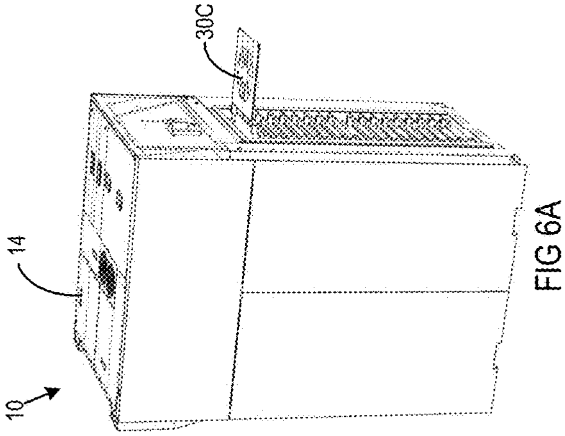
FIGS. 6A, 6B and 6C are perspective views of the tester apparatus illustrating insertion or removal of portable cartridges into or out of an oven defined by a frame.
Figure 6B:
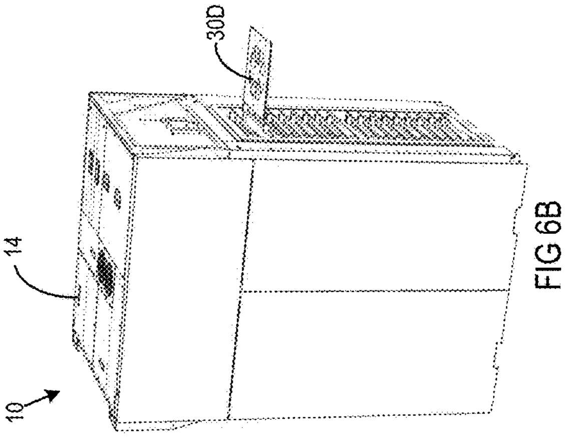
Figure 6C:
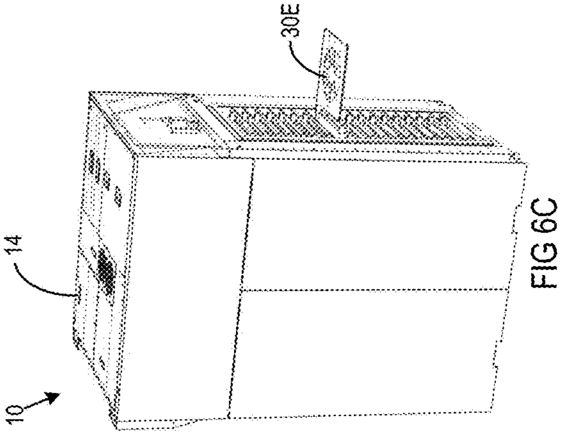
Figure 7:
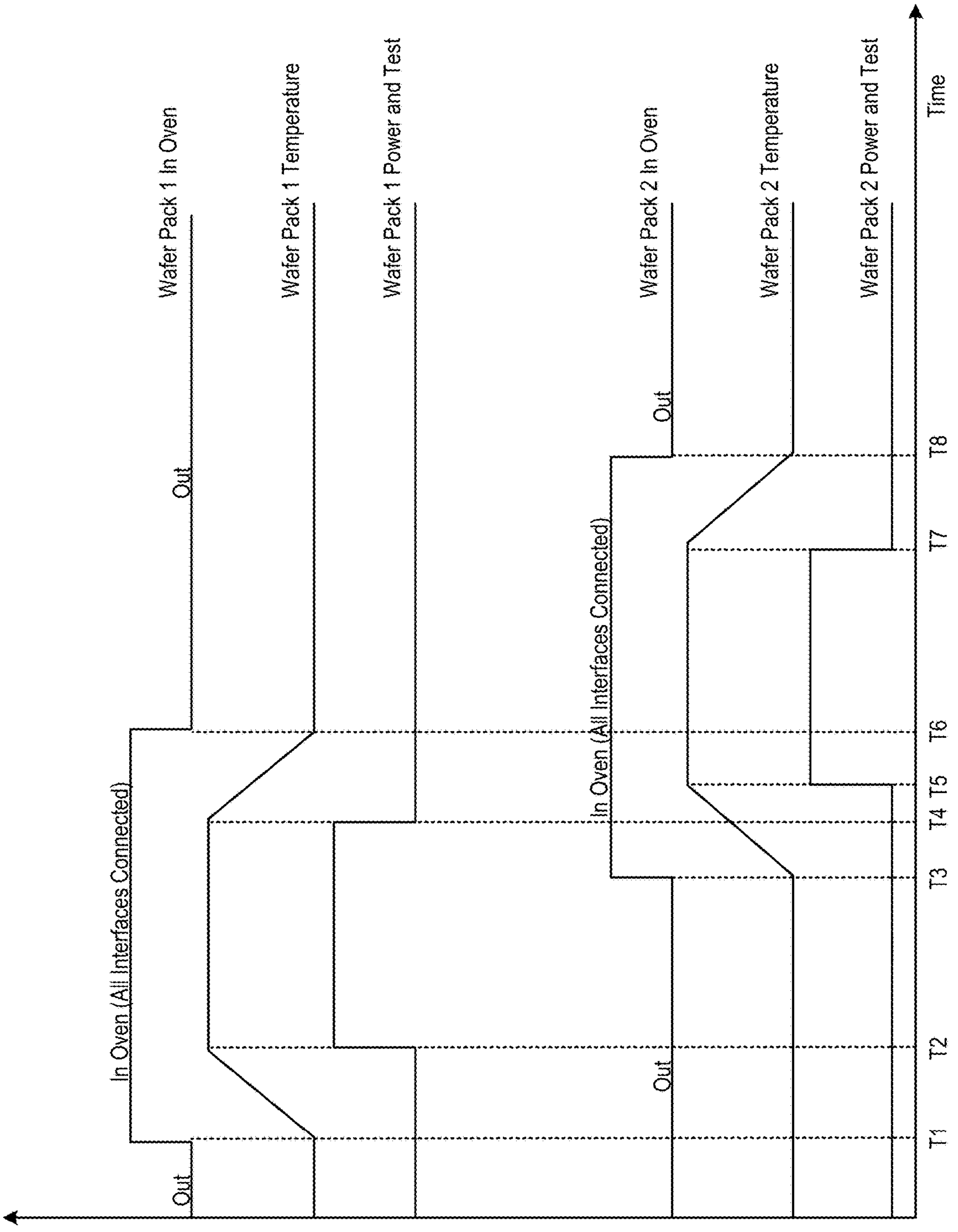
FIG. 7 is a time chart showing how one cartridge can be inserted and used for testing electronic devices of wafers and subsequent insertion of another cartridge.

FIGS. 6A, 6B and 6C illustrate how cartridges 30C, 30D and 30E can be inserted or be removed at any time while all other cartridges are being used to test devices of wafers and may be in various states of temperature ramps. FIG. 7 illustrates the concept in more detail. At time T1 a first cartridge is inserted into the frame 14 while a second cartridge is outside the frame 14. At T1 heating of the first cartridge is initiated. Between T1 and T2 the temperature of the first cartridge increases from room temperature, i.e. about 22° C., to a testing temperature that is 50° C. to 150° C. higher than room temperature at T2. At T2 power is applied to the first cartridge and the devices in the first cartridge are tested. At T3, a second cartridge is inserted into the frame 14 and heating of the second cartridge is initiated. At T4, testing of the first cartridge is terminated. At T4, cooling of the first cartridge is also initiated. At T5, the second cartridge reaches testing temperature and power is provided to the second cartridge and the wafer in the second cartridge is tested. At T6, the second cartridge reaches a temperature close to room temperature and is removed from the frame 14. A third cartridge can then be inserted in place of the first cartridge. At T7, testing of the second cartridge is terminated and cooling thereof is initiated. At T8, the second cartridge has cooled down to room temperature or close to room temperature and is removed from the frame 14.

Different tests can be conducted at different temperatures. By way of example, a cartridge may be inserted and a test be run at room temperature. Another test can be conducted during an upward ramp in temperature. A further test can be conducted at an elevated temperature. A further test can be conducted during a downward ramp in temperature. Two of these tests can be a single test that runs from one temperature stage to the next.

Figure 8:
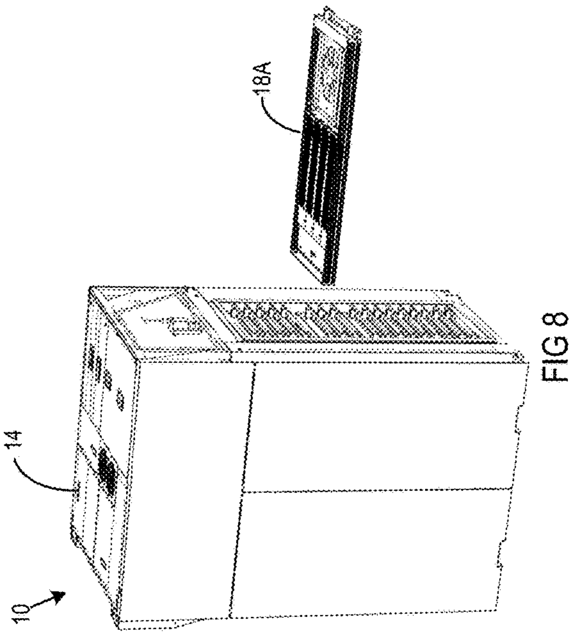
FIG. 8 is a perspective view of the tester apparatus illustrating insertion or removal of one slot assembly.

As shown in FIG. 8, one slot assembly 18A can be removed or be inserted into the frame 14. The slot assembly 18A can be inserted or be removed while the other slot assemblies within the frame 14 are used for testing devices of wafers as described with reference to FIG. 7.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A testing apparatus comprising:

a frame;

a plurality of slot assemblies inserted into the frame, each slot assembly including:

a slot assembly body;

a hinge attached to the slot assembly body; and a door attached to the slot assembly body by the hinge, the door being movable between an open position wherein the respective wafer pack is insertable into the slot assembly and a closed position wherein the door forms part of a sealed wall; and a first slot assembly interface located on the slot assembly body;

a plurality of wafer packs, each wafer pack including:

a wafer pack body for holding a respective wafer;

a plurality of wafer pack contacts held by the wafer pack body for making contact with contacts on the wafer;

a wafer pack interface connected to the wafer pack contacts, each wafer pack being insertable with a respective wafer into the frame and a respective wafer pack interface connecting with a respective first slot assembly interface; and a tester connected through the first slot assembly interfaces, the wafer pack interfaces and the wafer pack contacts to the wafer pack contacts of the wafers in the testing stations to test the microelectronic devices by providing at least power to each microelectronic device and measuring a performance of the microelectronic device.

2. The testing apparatus of claim 1, wherein each wafer pack is horizontally insertable with a respective wafer into the frame and a respective wafer pack interface connects vertically with a respective first slot assembly interface.

3. The testing apparatus of claim 2, wherein the respective wafer pack interface connects with the respective first slot assembly interface when the respective wafer pack moves vertically downward.

4. The testing apparatus of claim 2, wherein each wafer pack includes a respective backing board and a respective thin chuck with the respective wafer between the respective thin chuck and respective backing board and the respective wafer pack interface is on the respective backing board.

5. The testing apparatus of claim 4, wherein the respective backing board is above the respective wafer.

6. The testing apparatus of claim 1, further comprising:

a plurality vacuum interfaces on the frame for providing vacuum air pressure, wherein each slot assembly includes:

a vacuum interface, on each slot assembly body, that engages with a respective vacuum interface on the frame when the slot assembly is inserted into the frame.

7. The testing apparatus of claim 6, wherein the vacuum air pressure is applied to a respective space within each respective wafer pack to ensure proper contact between the respective wafer pack contacts and the respective contacts on the wafer.

8. The testing apparatus of claim 6, wherein each slot assembly includes a respective thermal chuck, each wafer pack includes a respective backing board and a respective thin chuck with the respective wafer between the respective thin chuck and respective backing board and the respective wafer pack interface is on the respective backing board, and the vacuum air pressure is applied to a respective space between the respective thermal chuck a respective thin chuck.

9. The testing apparatus of claim 1, wherein the slot assemblies are inserted into the frame by sliding the respective slot assemblies separately from one another into the frame.

10. The testing apparatus of claim 1, further comprising:

a front seal between a first of the slot assemblies and a second of the slot assemblies.

11. The testing apparatus of claim 10, further comprising:

a front seal between a first of the slot assemblies and the frame.

12. The testing apparatus of claim 10, wherein the respective wafer pack is insertable into the slot assembly and a closed position wherein the door forms part of a sealed wall formed jointly by the door and the front seal between the first slot assembly and the second slot assembly.

13. A method of testing microelectronic devices comprising inserting a plurality of slot assemblies into a frame;

making contact between a plurality of wafer pack contacts held by a wafer pack body of a plurality of respective wafer packs and contacts on each of a plurality of respective wafers;

moving a door attached to the slot assembly body by a hinge into an open position wherein the respective wafer pack is inserted into the slot assembly and a closed position wherein the door forms part of a sealed wall;

inserting each wafer pack with a respective wafer into a respective slot assembly inserted into the frame;

moving the door into a closed position wherein the door forms part of a sealed wall;

connecting respective wafer pack interfaces on the respective wafer packs with respective first slot assembly interfaces on respective slot assembly bodies of the respective slot assemblies; and testing microelectronic devices on the wafers with a tester connected through the respective first slot assembly interfaces, the wafer pack interfaces, and the wafer pack contacts to the contacts of the wafers by providing at least power to each microelectronic device and measuring a performance of the microelectronic device.

14. The method of claim 13, wherein each wafer pack is horizontally inserted with a respective wafer into the frame and a respective wafer pack interface connects vertically with a respective first slot assembly interface.

15. The method of claim 14, wherein the respective wafer pack interface connects with the respective first slot assembly interface when the respective wafer pack moves vertically downward.

16. The method of claim 14, wherein each wafer pack includes a respective backing board and a respective thin chuck with the respective wafer between the respective thin chuck and respective backing board and the respective wafer pack interface is on the respective backing board.

17. The method of claim 16, wherein the respective backing board is above the respective wafer.

18. The method of claim 13, further comprising:

engaging a vacuum interface on each slot assembly body with a respective vacuum interface on the frame when the slot assembly is inserted into the frame; and providing vacuum air pressure to the slot assemblies through the respective vacuum interfaces.

19. The method of claim 18, wherein the vacuum air pressure is applied to a respective space within each respective wafer pack to ensure proper contact between the respective wafer pack contacts and the respective contacts on the wafer.

20. The method of claim 18, wherein each slot assembly includes a respective thermal chuck, each wafer pack includes a respective backing board and a respective thin chuck with the respective wafer between the respective thin chuck and respective backing board and the respective wafer pack interface is on the respective backing board, and the vacuum air pressure is applied to a respective space between the respective thermal chuck a respective thin chuck.

21. The method of claim 13, further comprising:

inserting the slot assemblies into the frame by sliding the respective slot assemblies separately from one another into the frame.

22. The method of claim 13, further comprising:

locating a front seal between a first of the slot assemblies and a second of the slot assemblies.

23. The method of claim 22, further comprising:

locating a front seal between a first of the slot assemblies and the frame.

24. The method of claim 22, wherein the door forms part of a sealed wall formed jointly by the door and the front seal between the first slot assembly and the second slot assembly.

* * * * *